United States Patent
Rasa et al.

(10) Patent No.: US 9,922,870 B2
(45) Date of Patent: Mar. 20, 2018

(54) METHOD FOR APPLYING AN IMAGE OF AN ELECTRICALLY CONDUCTIVE MATERIAL ONTO A RECORDING MEDIUM AND DEVICE FOR EJECTING DROPLETS OF AN ELECTRICALLY CONDUCTIVE FLUID

(71) Applicant: OCÉ-TECHNOLOGIES B.V., Venlo (NL)

(72) Inventors: Mircea V. Rasa, Eindhoven (NL); Marcel Slot, Baarlo (NL)

(73) Assignee: OCE-TECHNOLOGIES B.V., Venlo (NL)

( * ) Notice: Subject to any disclaimer, the term of this patent is extended or adjusted under 35 U.S.C. 154(b) by 373 days.

(21) Appl. No.: 14/028,203

(22) Filed: Sep. 16, 2013

(65) Prior Publication Data
US 2014/0099788 A1 Apr. 10, 2014

(30) Foreign Application Priority Data
Oct. 9, 2012 (EP) .................................... 12187800

(51) Int. Cl.
| B05D 3/06 | (2006.01) |
| H01L 21/768 | (2006.01) |
| H01L 21/67 | (2006.01) |
| C23C 4/08 | (2016.01) |
| C23C 4/123 | (2016.01) |
| H05K 3/14 | (2006.01) |

(52) U.S. Cl.
CPC .............. *H01L 21/768* (2013.01); *C23C 4/08* (2013.01); *C23C 4/123* (2016.01); *H01L 21/6715* (2013.01); *B41J 2202/04* (2013.01); *H05K 3/14* (2013.01); *H05K 2203/1344* (2013.01)

(58) Field of Classification Search
CPC ............................ C23C 14/5813; C23C 14/08
USPC ................ 427/596, 597, 554, 555, 557, 559
See application file for complete search history.

(56) References Cited

U.S. PATENT DOCUMENTS

| 5,132,248 | A | * | 7/1992 | Drummond | .......... | B41M 5/0047 347/1 |
| 5,961,861 | A | * | 10/1999 | McCay | ................ | B23K 26/032 219/121.63 |
| 2005/0093957 | A1 | * | 5/2005 | Gibson | ....................... | B41J 2/02 347/175 |
| 2006/0045962 | A1 | | 3/2006 | Miura | | |
| 2007/0004200 | A1 | * | 1/2007 | Akram | .................. | H01L 21/288 438/677 |
| 2010/0266783 | A1 | * | 10/2010 | Krengel | .................... | C23C 2/02 427/543 |

FOREIGN PATENT DOCUMENTS

| WO | WO 00/69235 A1 | 11/2000 |
| WO | WO 2010/063576 A1 | 6/2010 |

* cited by examiner

*Primary Examiner* — Dah-Wei D Yuan
*Assistant Examiner* — Nga Leung V Law
(74) *Attorney, Agent, or Firm* — Birch, Stewart, Kolasch & Birch, LLP (57) ABSTRACT

The invention relates to a method for applying an image of an electrically conductive material onto a recording medium. In the method, the recording medium is heated and the electrically conductive material is jetted onto the recording medium. The invention further relates to a device for ejecting droplets of an electrically conductive fluid onto a recording medium.

7 Claims, 5 Drawing Sheets

METHOD FOR APPLYING AN IMAGE OF AN ELECTRICALLY CONDUCTIVE MATERIAL ONTO A RECORDING MEDIUM AND DEVICE FOR EJECTING DROPLETS OF AN ELECTRICALLY CONDUCTIVE FLUID

The present invention relates to a method for applying an image of an electrically conductive material onto a recording medium. The present invention further relates to a device for ejecting droplets of an electrically conductive fluid.

BACKGROUND OF THE INVENTION

Methods of applying droplets of an electrically conductive fluid are known in the art. For example, EP2373451 describes a method to eject droplets of a fluid, such as a molten metal or a molten semiconductor on a recording medium. Droplets are ejected by generating a Lorentz force in the fluid close to an orifice of the droplet ejection device, and as a result of this Lorentz force, droplets are ejected through the orifice onto the recording medium.

This technique may be applied to jet material at a high temperature and is therefore suitable for jetting electrically conductive materials having a high melting point. Examples of such materials are molten metals, such as silver (melting point (mp)=972° C.), copper (mp=1085° C.), gold (mp=1064° C.) and titanium (mp=1668° C.). Alternatively, an example of such materials are molten semiconductors, such as germanium (mp=938° C.). Jetting of droplets of silver or copper onto a silicon recording medium may be useful in the production of solar cells. For producing solar cells, lines of a material comprising silver and/or copper may be applied onto a silicon surface. These lines comprising silver and/or copper may function as an electrode in the solar cell. In order to obtain a highly efficient solar cell, it is important to have good electric conductivity, both through the electrodes and between the electrodes and the silicon substrate. It was found that there is room for improvement regarding the electrical conductivity within solar cells produced by printing lines of silver and/or copper onto a silicon substrate using the method as disclosed in EP2373451.

It is an object of the invention to provide an improved method for applying an image of an electrically conductive material onto a recording medium.

It is a further object of the invention to provide a device for carrying out the improved method.

The first object of the invention is achieved in a method for applying an image of an electrically conductive material onto a recording medium, the method comprising the steps of:
 a) selecting an electrically conductive material and selecting a recording medium comprising a first material, wherein the electrically conductive material and the first material are capable of forming an eutectic alloy;
 b) heating at least a part of the recording medium; and
 c) ejecting a droplet of the electrically conductive material onto the part of the recording medium,
wherein the at least a part of the recording medium is heated to a temperature above a melting point of the first material.

In the method according to the present invention, an image may be build on a recording medium by applying droplets of an electrically conductive material onto the recording medium. Using the method according to the present invention, an image may be formed that is electrically conductive. The conductivity of the image may depend e.g. on the material applied onto the recording medium and on the image itself. For example, if the image formed is continuous, for example a line, or an area, then the image of the electrically conductive material may be electrically conductive itself. Forming conductive patterns on a recording medium may be useful, e.g. in the production of solar cells or in the production of other electronics. By printing a line of a conductive material, such as silver, copper or an alloy thereof, an electrode may be formed on the recording medium. In the method according to the present invention, in step a), an electrically conductive material and a recording medium comprising a first material are selected, wherein the electrically conductive material and the first material are capable of forming an eutectic alloy. Examples of electrically conductive material-first material combinations that are capable of forming an eutectic alloy are e.g. Al—Ge, Au—Ge, Al—Si, Au—Si, Cu—Si and Ag—Si.

In the method according to the present invention, at least a part of the recording medium is heated in step b). In step c), droplets of the electrically conductive material are ejected onto the part of the recording medium. Step b) may be performed before step c). Alternatively, step b) and step c) are performed simultaneously. In both cases, the recording medium may be at least locally heated to a temperature above a melting point of the first material.

In the method according to the present invention, in step b), at least a part of the recording medium is heated. The recording medium may be heated to a temperature above the melting point of the first material in step b). The recording medium may be heated by suitable heating means. The recording medium may be heated locally. Alternatively, the entire recording medium may be heated. In case the recording medium comprises a (semi-)conductive material, the recording medium may be heated e.g. by applying an electrical current to the recording medium. Alternatively, the recording medium may be heated by placing the recording medium (and optionally also the jetting device used) in a controlled environment having an elevated temperature. Optionally, the recording medium may be heated using a plurality of heating means. Thus, the first material may be molten when a droplet of the electrically conductive material is jetted on the recording medium. If the recording medium consists essentially of the first material, then the recording medium should preferably be locally molten. For example, a thin layer of the surface of the recording medium may be molten, whereas the bulk remains solid. In case the recording medium comprises a plurality of compounds, the first material may melt upon heating the recording medium, whereas other components comprised in the recording medium may not melt.

Local melting of the first material may be achieved e.g. by locally irradiating the recording medium with a laser. Optionally, also the heat of a droplet applied onto the recording medium may be used to increase the temperature of the first material to a temperature above the melting point of the first material. If appropriate, the recording medium may be irradiated during short time-interval, to ensure that only a small part of the recording medium melts, leaving intact the framework formed by the recording medium. By applying a droplet of molten fluid on the recording medium, the first material and the electrically conductive material may mix to some extent. Mixing may take place e.g. because of the impact of the droplet on the partially molten recording medium. In addition, also diffusion may cause mixing of the materials, especially at higher temperatures.

When the materials are mixed, a eutectic alloy may be formed upon cooling, said alloy comprising both the first material and the electrically conductive material. Depending on the amount of electrically conductive material applied and on the mixing of the materials, also (pure) electrically conductive material may solidify. A three layer structure may be formed, wherein the recording medium comprises a layer of the first material and is further provided with a layer of the eutectic alloy and a layer of the electrically conductive material. Optionally, solid particles of the eutectic alloy and of the electrically conductive material may be mixed to some extent.

The formation of the eutectic alloy may improve conductivity between the image of the electrically conductive material and the recording medium. For example, it was found that in case of an Ag—Si eutectic alloy, the contact resistance may be lower in a system comprising the Ag—Si eutectic alloy compared to a system not comprising the eutectic alloy.

It was surprisingly found that the use of a of electrically conductive material-first material combination that is capable of forming an eutectic alloy, in combination with heating of the recording medium may improve the efficiency of solar cells produced by said method. Heating of the at least part of the recording medium may slow down the cooling of the electrically conductive material after is has been deposited on the recording medium and may thereby slow down solidification of the material. Without wanting to be bound to any theory, it is believed that this may have at least two beneficial effects. In the first place, a droplet of the electrically conductive material may stay liquid until an adjacent droplet is applied onto the medium. When two fluid droplets are positioned in close proximity to one another, then the droplets may merge to some extent. In case a line of droplets is printed to form an electrode and all droplets merge to some extent, then good connectivity between the droplets applied onto the recording medium—and thus, within the electrode—is provided, which may result in good electrical conductivity. This may improve the efficiency of a solar cell comprising such electrode. In the second place, the droplet of the electrically conductive material is applied onto a recording medium having an increased temperature, which may slow down cooling and solidification of the droplet of fluid. If the droplet stays fluid for an increased period of time, the fluid may flow to some extent over the surface of the recording medium, improving the contact of the electrically conductive material and the recording medium. If the recording medium comprises a (semi-) conductive material, the electrical conductivity within an assembly of the recording medium and the image of the electrically conductive material applied thereon may be further improved by the improved contact between the electrically conductive material and the recording medium. In addition, adhesion of the image onto the recording medium may improve if the contact surface between the droplet of electrically conductive material and the recording medium increases by improved flow of the droplet.

In an embodiment, step b) and c) are performed simultaneously. The recording medium may be pre-heated to an elevated temperature. The elevated temperature may, but does not necessarily have to be a temperature above the melting temperature of the first material. Pre-heating of the recording medium may be done e.g. by using a laser or by keeping the recording material in an environment at elevated temperature. The droplets of the electrically conductive material that are jetted onto the recording medium may be at a high temperature, such as a temperature above the melting temperature of the first material. When the droplets of the electrically conductive material are at a temperature above the melting temperature of the first material, then temperature of the first material may be further increased. This temperature increase may occur locally, i.e. at a position of droplet impact. Hence, only at a position of droplet impact, where local melting of the first material is desired, the temperature of the first material may be increased to a temperature above the melting point of the first material. The amount of first material that melts upon impact may depend on a plurality of parameters, e.g. on the temperature of the droplet, the size of the droplet, the heat capacity of the droplet and the first material and on the temperature of the first material before droplet impact. Hence, by using the method according to this embodiment, melting of the first material can be suitably controlled.

In an embodiment, a droplet of the electrically conductive fluid is ejected by applying a Lorentz force to the fluid. This force causes a motion in the conductive fluid. This motion may cause a part of the fluid to move from the fluid chamber through the orifice, thereby generating a droplet of the fluid. The Lorentz force is related to the electric current and the magnetic field vector; $\vec{F}=\vec{I}\times\vec{B}$. The Lorentz force resulting from the electric current and the magnetic field is generated in a direction perpendicular to both the electrical current and the magnetic field. By suitably selecting the direction and the magnitude of the electric current, as well as the direction and the magnitude of the magnetic field, the direction and the magnitude of the resulting Lorentz force may be selected. In the system according to the present invention, in normal operation, the magnetic field is provided and an electrical current is provided in the conductive fluid, such that a suitable force for ejecting a droplet is generated.

The jetting device in accordance with the present invention comprises a fluid chamber and has an orifice extending from the fluid chamber to an outer surface of the fluid chamber element. In operation, the fluid chamber comprises an electrically conductive fluid. When applying an actuation pulse, a Lorentz force is generated within the fluid, causing the fluid to move through the orifice in a direction away from the fluid chamber. The actuation pulse may be applied by applying a pulsed magnetic field and a continuous electrical current, or a pulsed electrical current in a continuous magnetic field, or a combination thereof. Alternatively, a constant Lorentz force may be generated within the fluid by applying a constant electrical current to the electrically conductive fluid in a constant magnetic field. However, application of a constant Lorentz force to the electrically conductive fluid may result in the ejection of a stream of the electrically conductive fluid, instead of in the ejection of droplets.

Other techniques may be applied as well to eject droplets of the electrically conductive fluid, such as piezo actuation or thermal inkjet. However, actuation based on Lorentz force actuation may be better suited to eject droplets of a fluid at high temperatures. For example, if droplets of fluid silver are to be jetted, the temperature of the fluid is at least 972° C., which is the melting point of silver.

In an embodiment, in step b) of the method according to the present invention, the recording medium is heated using a laser. A laser provides a narrow beam of radiation. If the beam is pointed towards the recording medium, the recording medium may be locally irradiated by the laser beam. Upon irradiation of the recording medium by the laser beam, energy is provided at least locally to the recording medium, which may result in heating the recording medium at least locally. Different types of lasers are known in the art. The person skilled in the art will be able to suitably select a laser for use in the method according to the present invention, based e.g. on the type of recording medium applied.

In an embodiment, the electrically conductive material is a metal or a semiconductor. Metals and semiconductors are materials that in general have a good electric conductivity. For example, ejecting droplets of a molten metal may be used to print electronic circuits. By applying a printing technique to apply droplets of metal onto a recording medium, electronic circuits may be printed in a versatile way; i.e. the shape of the circuit may be easily adapted for the respective electronic circuits.

In an embodiment, the electrically conductive material has a melting point of at least 300° C. If the electrically conductive fluid has a high melting temperature, such as a melting temperature of 300° C. or higher, the fluid may cool down rapidly after ejection through the nozzle of the jetting device, because of possible large temperature differences between environment and droplet. In that case, it may be important to suitably control the temperature of the recording medium to suitably control the cooling of the droplet after ejecting and after application on the recording medium. In an embodiment, the electrically conductive material has a melting point of at least 600° C. In a further embodiment, the electrically conductive material has a melting point of at least 900° C.

In a further embodiment, the electrically conductive material is selected from at least one of the group consisting of silver, gold and copper. Silver and copper may be usefully applied in electronic devices, for example as electrodes. In addition alloys comprising at least one of copper and silver may be used. By applying an image of silver, copper or an alloy thereof onto a recording medium, electrically conductive parts, such as electrodes, may be efficiently applied onto the recording medium.

In an embodiment, the recording medium is a silicon substrate. In case the recording medium is a silicon substrate, the method according to the present invention may be used to produce a solar cell. By providing the silicon substrate with an image of an electrically conductive material, the silicon substrate may be provided with electrodes and a functioning solar cell may be produced. The silicon substrate may be e.g. a polycrystalline silicon substrate, a monocrystalline silicon substrate, a nanocrystalline silicon substrate or an amorphous silicon substrate. Optionally, the silicon substrate may be provided with a coating. For example, the coating may be applied on a side of the silicon substrate that may not be provided with an image of the electrically conductive material.

Alternatively, metallization of silicon substrates may be usefully applied in the manufacturing of integrated circuits (IC's) for use in electronic equipment, e.g. computers or mobile phones.

In an embodiment, the method further comprises the step of:

α) modifying the recording medium,
wherein step α) is carried out before step a). The recording medium may be modified to further optimize the surface properties of the recording medium. For example, an oxide layer, for example a silicon oxide layer, may be removed from the surface. This may be done e.g. via an etching process, or via reduction of the oxide containing layer using $H_2$. Alternatively, the surface of the recording medium may be coated with a suitable coating. For example, a thin layer of metal may be deposited on the recording medium, for example via screen printing or via Chemical Vapor Deposition (CVD). Alternatively, a thin layer of glass frit may be deposited on the recording medium.

In an embodiment, the electrically conductive material has a higher melting point than the first material. Preferably, the melting point of the electrically conductive material may be at least 50° C. higher than the melting point of the first material. For example, gold may be selected as the electrically conductive material, whereas germanium is selected as the first material. Gold has a melting point of 1064° C., whereas germanium has a melting point of 938° C. The phase diagram of a gold/germanium system shows a eutectic point, corresponding to a eutectic temperature of 356° C.

The droplet of the electrically conductive fluid expelled through a nozzle may have a temperature higher than the melting point of the first material. For these systems, the first material may be melted by applying a droplet of the electrically conductive fluid onto the recording medium. After the droplet has been applied onto the recording medium and the first material is—at least—partially molten, mixing of the two components may take place, e.g. because of diffusion or because of motion of the fluid. Upon cooling of the systems, the eutectic composition may be formed.

In a further aspect of the invention, a device for ejecting droplets of an electrically conductive fluid onto a recording medium is provided, the device comprising:

a fluid chamber body defining a fluid chamber and having an orifice extending from the fluid chamber to an outer surface of the fluid chamber element, the fluid chamber being at least partly arranged in a magnetic field;

magnetic field generating means for generating a magnetic field;

an actuation means comprising at least two electrically conductive electrodes, each electrode being arranged such that one end of each electrode is in electrical contact with the fluid in the fluid chamber;

heating means for heating the electrically conductive material, the device further comprising:

heating means for heating at least a part of the recording medium.

The device in accordance with the present invention comprises a fluid chamber body defining a fluid chamber and having an orifice extending from the fluid chamber to an outer surface of the fluid chamber element. The fluid chamber is adapted to comprise the electrically conductive fluid. The fluid chamber body comprises an orifice, the orifice extending from the fluid chamber to an outer surface of the fluid chamber body. Hence, a droplet of fluid may be ejected from the fluid chamber body via the orifice. The device according to the present invention also comprises actuation means. The actuation means may be means for actuating a droplet of the electrically conductive fluid by applying a Lorentz force.

The fluid chamber body is preferably made of a material, which is cost effectively machinable. The material for the fluid chamber body may be selected from, but is not limited to graphite, boron-nitride or silicon. When the fluid chamber body is made from silicon, the fluid chamber body may be made using etching techniques, for example. Alternatively, the fluid chamber body may be formed starting from a molten material which is poured into a mould and is cooled down such that the molten material solidifies. Afterwards, the mould may be removed yielding the fluid chamber body. In another embodiment, at least a part of the fluid chamber body may be made from a solid piece, using a mechanical technique, such as milling, drilling, sawing or the like, or a chemical technique, such as etching or the like. The fluid chamber body may be made out of one piece or may be assembled starting from a plurality of pieces using a suitable assembly technique, such as welding, gluing, nailing or the like.

Depending on the type of electrically conductive fluid, such as a molten metal or a molten semiconductor to be jetted, the fluid chamber body may need to be heat resistant. Preferably the body is resistant to temperatures up to 3000 K, which enables to handle a large range of electrically conductive materials. Also, it may be preferred that the material is resistant against corrosion by the electrically conductive fluids. Furthermore, the material of the fluid chamber, in particular at the orifice, is wettable by the fluid. If the fluid does not wet on the material, the fluid will contract itself and bead and consequently will not flow through the orifice when no (external) force is exerted on the fluid. By ensuring that the fluid chamber body is wettable by the fluid, the fluid will flow into the orifice without an additional force. For example, the fluid chamber may be coated with a tungsten carbide, such as WC, $W_2C$ and $W_3C$.

In an embodiment, the material of the fluid chamber body is not electrically conductive. This may be advantageous for preventing an electrical actuation current flowing into the fluid chamber body, since such a flow into the body material might decrease a generated actuation force. In a particular embodiment, the fluid chamber body comprises boron-nitride (BN).

Moreover, the electrically conductive material is a material that in the fluid state has an electric conductivity that is sufficient to generate a Lorentz force that is strong enough to eject a droplet of the fluid through the orifice, upon applying a certain current, in a given magnetic field and geometry of the fluid chamber body. Therefore, whether a fluid is an electrically conductive fluid in accordance with the present invention should be determined taking into account the conditions, for example the current and the magnetic field applied and on the geometry of the fluid chamber body.

The device in accordance with the present invention may further comprise heating means for heating the electrically conductive material. The electrically conductive fluid may be solid at ambient conditions. Therefore, the electrically conductive material may have to be molten. This may be done using suitable heating means. In addition, the temperature of the electrically conductive fluid may have to be further increased once it is molten. The temperature of a droplet of the electrically conductive material may influence the temperature of the recording medium. By applying droplets onto the recording medium that have a temperature higher than the temperature of the recording medium, the temperature of the recording medium may be increased. Optionally, the heat of the droplet may locally heat the recording medium to a temperature above the melting temperature of the recording medium. A Non-limiting example of suitable heating means for heating the electrically conductive fluid is an inductive coil provided around the fluid chamber body.

The device in accordance with the present invention may further comprise heating means for heating at least a part of the recording medium. The heating means may be e.g. a laser, or—in case the recording medium is electrically conductive—electrical current proving means for providing a current through the recording medium, thereby heating said medium. Preferably, the heating means are adapted such that the heating means are suited to locally heat the recording medium. The device may further comprise suitable positioning means for positioning the heating means with respect to the recording medium and with respect to the fluid chamber body.

In an embodiment, the heating means for heating the recording medium comprises a laser. A laser may be a suitable heating means, because it may locally irradiate the recording medium, thereby heating said recording medium. Since the beam of a laser may be essentially non-divergent, small parts of the recording medium may be irradiated selectively, whereas other parts of the recording medium may not be irradiated. Therefore, selected parts of the recording medium, such as parts of the recording medium to be provided with the image of the electrically conductive material, may be heated selectively. Different types of lasers are available varying a.o in intensity of the beam and wavelength of the radiation emitted. The person skilled in the art will be able to suitable select a laser, depending e.g. on the type of recording medium used and the desired temperature to be reached.

In an embodiment, the device further comprises a control unit configured to control the heating means for heating at least a part of the recording medium. The control unit may suitably control the heating means. For example, the control unit may control the amount of heat supplied to the recording medium. Optionally, the control unit may also control the parts of the recording medium which are heated, and which parts are not. For example, different parts of the recording medium may be heated to the respective desired temperatures, which may be different for the respective parts of the recording medium, depending on the print strategy requirements. Furthermore, the control unit may also control the other parts of the device for ejecting droplets of an electrically conductive fluid. For example, the control unit may control the amount of droplets that are ejected and/or may control the temperature of the droplet. By suitably controlling the heating means, it may be prevented that the recording medium is overheated, such that the recording medium melts. In addition, it may be ensured that sufficient heat is provided by the heating means, such that the temperature of the recording medium is within a predefined temperature range. The amount of heat that is to be provided by the heating means may depend e.g. on the material of the recording medium, the type of electrically conductive material, the amount and temperature of the electrically conductive material applied onto the recording medium, and the desired temperature of the recording medium.

In an embodiment, the control unit may comprise a feedback loop. The temperature of the recording medium may be measured during the jetting process using suitable temperature measuring means. When the temperature exceeds a predefined limit, the control unit may prevent the heating means from providing heat to the recording medium. When the temperature falls below another predefined limit, the control unit may start the heating means to apply heat. In that way, the temperature of the recording medium may be kept within a predefined temperature range. In a further embodiment, the control unit may detect the temperature of the recording medium and further compare this to a second temperature limit, the second temperature limit being higher than the predefined limit. For example, when the temperature exceeds the second temperature limit, there may be a risk of overheating (and possibly melting) of the recording medium. When the temperature exceeds this second temperature limit, the control unit may not only pause heating of the recording medium, but may also pause jetting of droplets onto the medium.

In an alternative embodiment, the control unit may comprise a feed-forward loop. This is particularly useful if the droplets of the electrically conductive fluid have a relatively large influence on the temperature of the recording medium. For example, if the droplets have a temperature higher than the temperature of the recording medium, the temperature of the recording medium may rise when a droplet of the electrically conductive material is applied to it. Alternatively, if the droplets have a relatively low temperature, the temperature of the recording medium may drop when droplets of the electrically conductive material are applied onto the recording medium. Thus, the temperature of the recording medium may depend on the amount and on the rate at which droplets of the electrically conductive material are applied to it. The data concerning the amount of droplets and the rate at which they are applied may be stored in a print job. Thus, based on the print job, the control unit may adapt the heating means to suitably heat the recording medium such that the temperature of the recording medium stays within the desired temperature range.

BRIEF DESCRIPTION OF THE DRAWINGS

These and further features and advantages of the present invention are explained hereinafter with reference to the accompanying drawings showing non-limiting embodiments and wherein.

DETAILED DESCRIPTION OF THE DRAWINGS

In the drawings, same reference numerals refer to same elements.

Figure 1:
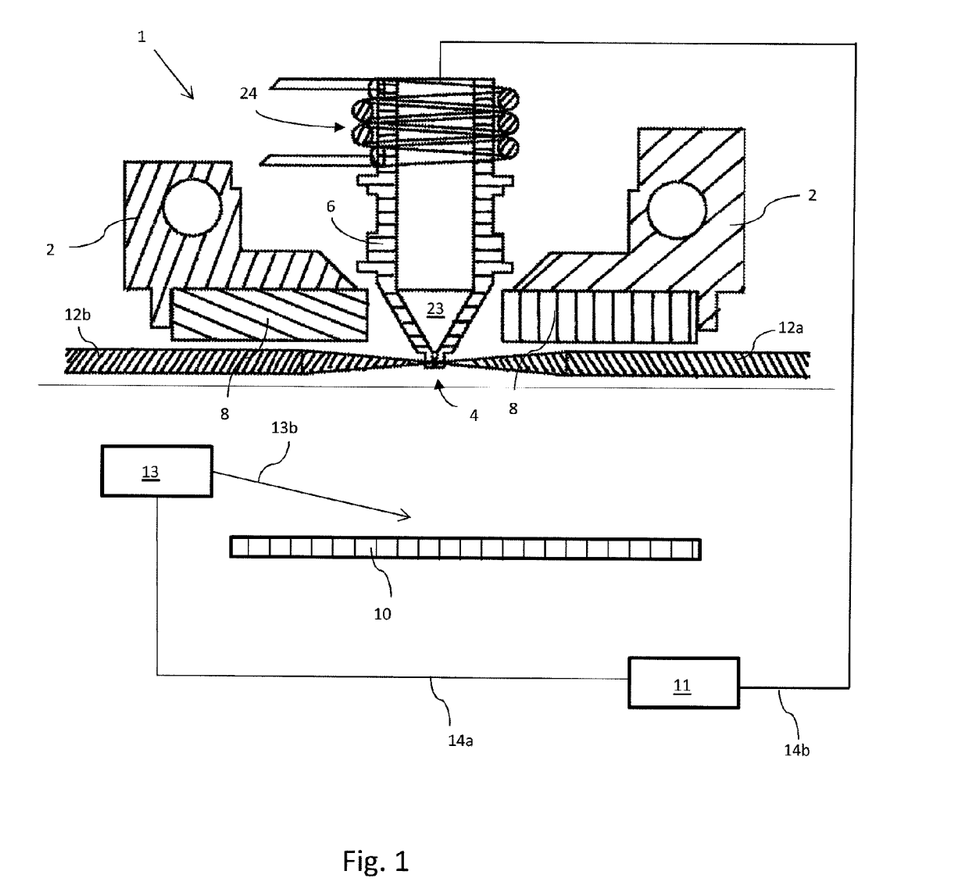
FIG. 1 shows a cross-sectional view of an embodiment of the device for ejecting droplets of an electrically conductive fluid.

FIG. 1 shows a cross-sectional view of a part of a device 1 for ejecting droplets of an electrically conductive fluid, for example a molten metal or a molten semiconductor.

The device for ejecting droplets 1 is provided with an orifice 4 through which a droplet of the fluid may be ejected. The orifice 4 is a through hole extending through a wall of a fluid chamber body 3. In the fluid chamber body 6 a fluid chamber is arranged. The fluid chamber 6 is configured to hold the electrically conductive fluid. In case the fluid to be ejected is a molten metal or a molten semiconductor, ejection of droplets of the fluid typically takes place at a high temperature. For example, the melting point of copper is 1085° C., the melting point of silver is 962° C. In that case, the fluid chamber body 6 needs to be heat resistant. Also, an inner wall of the through hole forming the orifice 4 needs to be wetting for the fluid in order to enable the fluid to flow through the orifice 4. If the surface of the fluid chamber body 6 is wetting with respect to the fluid, the fluid will not tend to form beads, but will easily spread and flow over the surface and is thus enabled to flow into and through the orifice 4.

Several techniques may be applied for actuating the electrically conductive fluid, such as piezoelectric actuation or thermal actuation. The device shown in FIG. 1, comprises actuating electrodes 12a, 12b and a magnet 8 as actuation means. The magnet 8 may be applied to provide a magnetic field. The actuating electrodes 12a, 12b may be applied to apply an electric current to the electrically conductive fluid. As explained above, providing a current through an electrically conductive fluid that is placed in a magnetic field, results in the generation of a Lorentz force in the fluid. Thus, in the device shown in FIG. 1, the electrically conductive fluid may be actuated by Lorentz actuation. For applying a Lorentz force in the conductive medium, the jetting device 1 is provided with permanent magnets 8. More than one magnet may be applied. Optionally, the magnet 8 may be arranged between magnetic field concentrating elements (not shown), for example magnetic field concentrating elements made of a magnetic field guiding material such as iron. The jetting device 1 is further provided with two actuating electrodes 12a, 12b (hereinafter also referred to as actuating electrodes 12) both extending into the fluid chamber body 6 through a suitable through hole such that at least a tip of each of the actuating electrodes 12 is in direct electrical contact with the conductive medium present in the fluid chamber 6. The actuating electrodes 12 are each operatively connected to a suitable electrical current generator (not shown) such that a suitable electrical current may be generated through the electrodes 12 and the electrically conductive fluid present between the tips of the electrodes 12. Optionally, the magnets 8 may be cooled by suitable cooling means.

The electrodes 12 are made of a suitable material for carrying a relatively high current, and optionally, for being resistant against high temperatures. The electrodes 12 may be suitably made of tungsten (W), although other suitable materials are contemplated.

A recording medium 10 is provided. By operation of the jetting device 1 described above the recording medium 10 may be provided with an image of the electrically conductive fluid comprised in the fluid chamber body 6. The recording medium 10 may be supported and positioned with respect to the jetting device 1 using suitable recording medium holding means (not shown). Optionally, the recording medium holding means may move the recording medium with respect to the jetting device 1, such that different parts of the recording medium 10 may be provided with the image of the electrically conductive medium. Alternatively, or additionally, the jetting device 1 may be provided with suitable moving means (not shown), such that the jetting device 1 may be moved with respect to the recording medium 10.

The jetting device is further provided with heating means 13 for heating the recording medium 10. In the embodiment shown in FIG. 1, the heating means locally heats the recording medium 10 by locally applying radiation 13b to the recording medium. The heating means 13 may be e.g. a lamp or a laser. The radiation 13b may be e.g. visible light, infrared light or UV radiation. Alternatively, any suitable heating means may be applied. The heating means 13 may locally heat the recording medium 10 or may heat the whole recording medium 10 in one time. The heating means may heat the recording medium 10 using any suitable type of heat providing means, e.g. an electric current, a flame or radiation.

In the embodiment shown in FIG. 1, the fluid chamber 6 is provided with a heating coil 24 for heating the material contained in the fluid chamber 23 and optionally also the fluid chamber body. By heating the fluid and keeping the fluid within a predetermined temperature range, the temperature op the recording medium 10 may be more easily controlled.

The jetting device 1 as shown in FIG. 1 is further provided with a control unit 11. The control unit 11 is configured to control the heating of the substrate 11 by controlling the amount of energy provided to the recording medium 10 by the heating means 13. The control unit 11 is operatively connected to the heating means 13, for example via an electrical connection 14a. The amount of energy that is to be supplied to the recording medium 10 may depend e.g. on the type of substrate, temperature of environment, temperature and size of droplets of the electrically conductive fluid expelled through the nozzle 4, frequency of droplet ejection, etc. Based on any of these conditions, the control unit may suitable control the heating unit 13 to provide the desired amount of heat. As shown in FIG. 1, the control unit may also be operatively connected to the other parts of the jetting device, as is shown by connection 14b. For example, the control unit 11 may be connected to the heating coil 24 configured to heat the fluid in the fluid chamber 23.

Figure 2:
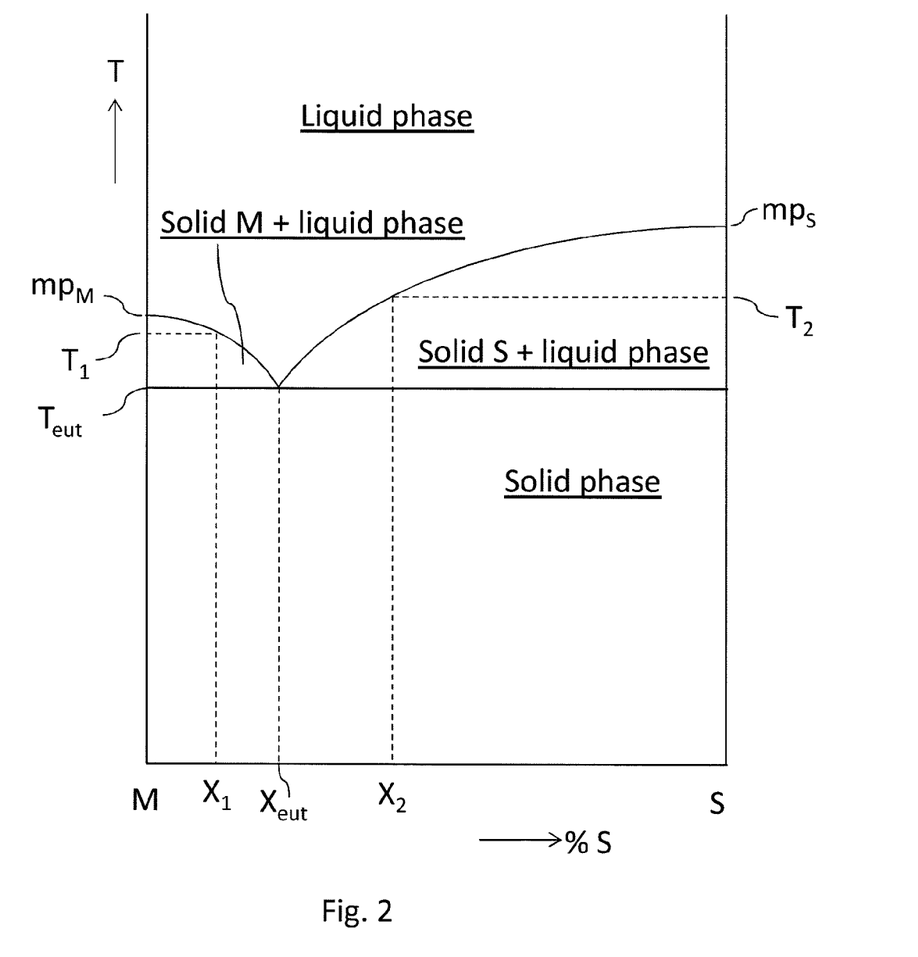
FIG. 2 shows a schematic representation of a two component phase-diagram.

FIG. 2 shows an example of a two component phase diagram of the two components M and S. A phase diagram is known in the art as a diagram used to show conditions at which thermodynamically distinct phases can occur at equilibrium. M represents the first component. For example, M may be a metal which is applied onto a recording medium. S represents the second component S. Component S may be a suitable material for the recording medium, such as Si or Ge. The two-phase diagram as depicted does not show any pressure dependencies. However, in practice, the dependency on pressure may be limited for solid and liquid systems. The vertical axis schematically shows the temperature. The horizontal axis represents the composition of the system. The leftmost part of the horizontal axis corresponds to a system consisting of component M. The rightmost part of the horizontal axis corresponds to a system consisting of component S. The phase-diagram as depicted in FIG. 2 shows a eutectic point. The eutectic point is located at the intersection of the eutectic temperature ($T_{eut}$) and the eutectic composition ($X_{eut}$). The eutectic composition $X_{eut}$ is a mixture of the components M and S and has a single chemical composition. For example, the phase-diagrams of Si—Al and Si—Ag systems show a eutecticum. The eutectic composition solidifies at a temperature lower than any other composition made up of the same ingredients. 4 Different areas may be observed in the phase-diagram depicted in FIG. 2. The first area is delimited by the horizontal axis and $T_{eut}$ and is indicated as "solid phase". In this first area, the material is solid for all possible compositions. In a second area, indicated as "liquid phase", the material is fluid, irrespective of the composition. In a third area, indicated as "Solid M+Liquid Phase", solid M and a liquid phase comprising both M and S may coexist. In a fourth area, indicated as "Solid S+Liquid Phase", solid S and a liquid phase comprising both M and S may coexist.

Figure 3A:
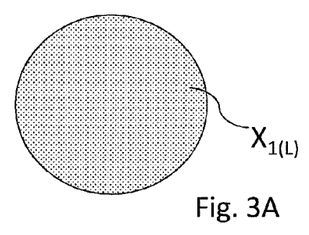
FIG. 3A-H show examples of the solidification of two different compositions according to the phase-diagram of FIG. 2.

In FIG. 2, two compositions are indicated; $X_1$ and $X_2$. For each of these compositions, it will be explained below, with reference to FIG. 3A-H, what happens when a liquid having either of the compositions $X_1$ or $X_2$, cools down and solidifies. As mentioned above, the electrically conductive material may be jetted onto the recording medium. The droplet of electrically conductive material may preferably be fluid when it impacts on the recording medium. For elucidating the present invention, it is presumed that the electrically conductive material corresponds to component M and the material of the recording medium corresponds to component S. Further, it is presumed that at least an upper layer of the recording medium is locally in a molten state. If a droplet of the molten electrically material is jetted onto the partially molten recording medium, component M and component S may mix, e.g. because of the impact of the droplet. A mixed fluid may be formed, comprising both M and S. It is presumed that composition $X_1$ ($X_{1(L)}$) is formed when the droplet is applied onto the recording medium. This is depicted in FIG. 3A. Please note that in another embodiment, a different composition may be formed when a droplet is applied onto the recording medium.

Figure 3B:
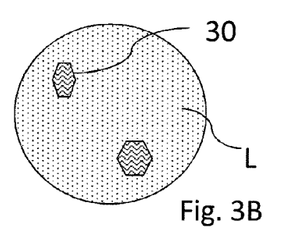
Figure 3C:
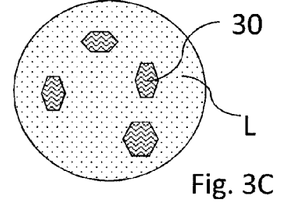
Figure 3D:
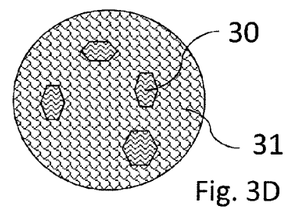
Figure 3E:
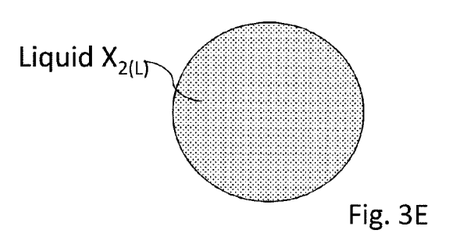
Figure 3F:
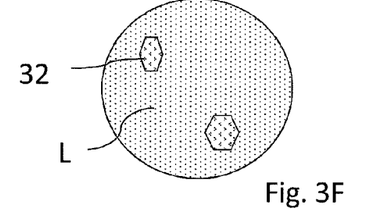
Figure 3G:
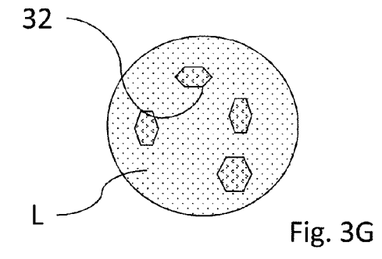
Figure 3H:
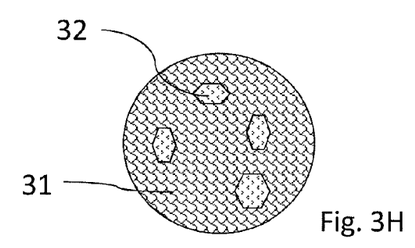

According to the phase-diagram, the fluid will cool down, without its composition being changed, until the line separating the area "liquid phase" from the area "solid M+liquid phase is reached". Once this line is reached at $T_1$, phase separation starts taking place. Pure M solidifies from the liquid phase, forming crystals of M 30, which is depicted in FIG. 3B. By crystallization of M, the liquid L becomes more rich in component S. The crystallization of M continues, upon further decrease in temperature. Therefore, more crystals of M 30 may be formed (see FIG. 3C) and the liquid L becomes even richer in S. Crystallization of M continues until the eutectic point is reached. When the eutectic point is reached, no more liquid L is present and the eutectic composition $X_{eut}$ solidifies, thereby forming $X_{eut}$ crystals 31. Thus, by cooling down a fluid having the composition $X_1$, a solid may be formed, comprising crystals of M 30 and crystals of $X_{eut}$ 31, wherein the crystals of M 30 are surrounded by the $X_{eut}$ crystals 31, as is shown in FIG. 3D. In a second embodiment, composition $X_2$ is formed when the droplet is applied onto the recording medium. According to the phase-diagram, the fluid ($X_{2(L)}$) will cool down, without its composition being changed (FIG. 3E), until the line separating the area "liquid phase" from the area "solid S+liquid phase is reached". Once this line is reached at $T_2$, phase separation starts taking place. Pure S solidifies from the liquid phase, forming crystals of S 32 (FIG. 3F). By crystallization of S, the liquid L becomes more rich in component M. The crystallization of S continues, upon further decrease in temperature, thereby forming more crystals of component S 32 (FIG. 3G). Crystallization of S continues, the liquid phase L thereby becoming more rich in component M, until the eutectic point is reached. When the eutectic point is reached, no more liquid L is present and the eutectic composition $X_{eut}$ solidifies, thereby forming $X_{eut}$ crystals 31. Thus, by cooling down a fluid having the composition $X_2$, a solid may be formed, comprising crystals of S 32 and crystals of $X_{eut}$ 31, wherein the crystals of S 32 are surrounded by the $X_{eut}$ crystals 31, as is shown in FIG. 3H.

Thus, by suitably controlling the temperature of the recording medium, the composition of the recording medium provided with the image may be suitably controlled. Please note that the heating means 13 configured to heat the recording medium 10 may not only be used to heat the recording medium 10 before application of a droplet, it may also be applied to let the recording medium 10 provided with the image of the electrically conductive material cool down in a controlled manner, by suitably applying heat to the recording medium 10 provided with the image after the electrically conductive material has been provided to said medium 10. By controlled cooling of the system, the system may solidify in a controlled way, thereby allowing the desired solids to be formed.

Depending on the conditions of the jetting process, e.g. the amount of material of the recording medium that is molten, the volume of a droplet applied on said medium and the extent of mixing between the electrically conductive medium and the material of the recording medium, different solid compositions may be formed upon cooling of the system. Moreover, the solid compositions formed during solidification of the mixed fluids may be present in addition to crystals of the electrically conductive material. For example, solid electrically conductive material may be present, due to limited mixing with molten material of the recording medium. The presence of crystals, comprising a component comprising both M and S may provide the printed medium with improved properties, such as improved electrical conductivity. The mixed crystals may be randomly distributed throughout the image provided on the recording medium. Alternatively, the mixed crystals may only be present at an interface layer between recording medium and electrically conductive material.

Figure 4:
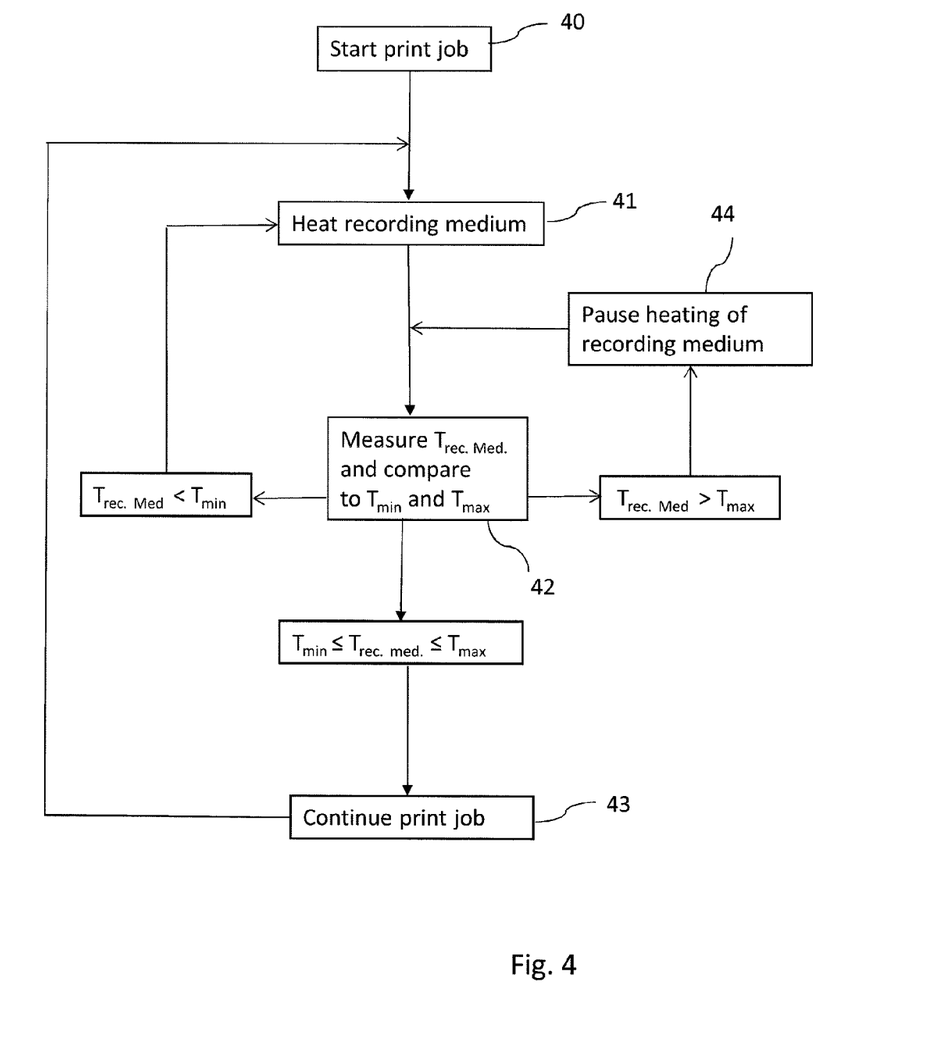
FIG. 4 shows a flow diagram of a method according to a first embodiment of the present invention.

FIG. 4 shows a flow diagram of a method according to a first embodiment of the present invention for applying an image of an electrically conductive material onto a recording medium. In step 40, the print job is started. The device 1 for jetting droplets of the electrically conductive fluid is then in an operative state and may be jetting, thereby expelling droplets of the electrically conductive fluid. The control unit 11 may control expelling of droplets by the inkjet device 1. In a second step 41, the recording medium is heated. Heating of the recording medium may be done using suitable heating means. In addition to heating the recording medium, the fluid chamber body comprising the electrically conductive material may optionally be heated as well. In a third step 42, the temperature of the recording medium $T_{rec.\ med.}$ may be measured. The temperature of the recording medium may be measured using suitable temperature measuring means, such as, but not limited to a thermocouple or a pyrometer. Furthermore, in the third step 42, $T_{rec.\ med.}$ may be compared to predetermined temperatures $T_{min}$ and $T_{max}$. In case the temperature of the recording medium is in the predefined temperature range between $T_{min}$ and $T_{max}$, the print job may be continued in the fourth step 43. When the print job is continued, the second step may be repeated and the recording medium may be heated again. After heating of the recording medium, its temperature may be measured, etc. In case the temperature of the recording medium exceeds $T_{max}$, and thus is higher than the predefined temperature range, the heating of the recording medium is paused in the fifth step 44. By pausing the heating, the recording medium may cool down and its temperature may drop. After pausing the heating, the temperature may be measured again and it may again be compared to predetermined values. As long as the temperature of the recording medium exceeds the predefined limit $T_{max}$, the cycle defined by the third step 42 and the fifth step 44 may be repeated. When the temperature is again within the predefined temperature range, the print job may be continued in the fourth step 43.

In case the temperature of the recording medium is lower than $T_{min}$, the second step 41 is repeated and the recording medium is heated. After repeating the second step, the temperature of the recording medium may be measured again in the third step 42. The cycle defined by the second step 41 and the third step 42 may be repeated as long as the temperature of the receiving medium is lower than $T_{min}$, thereby bringing the temperature within the predefined temperature range.

Figure 5:
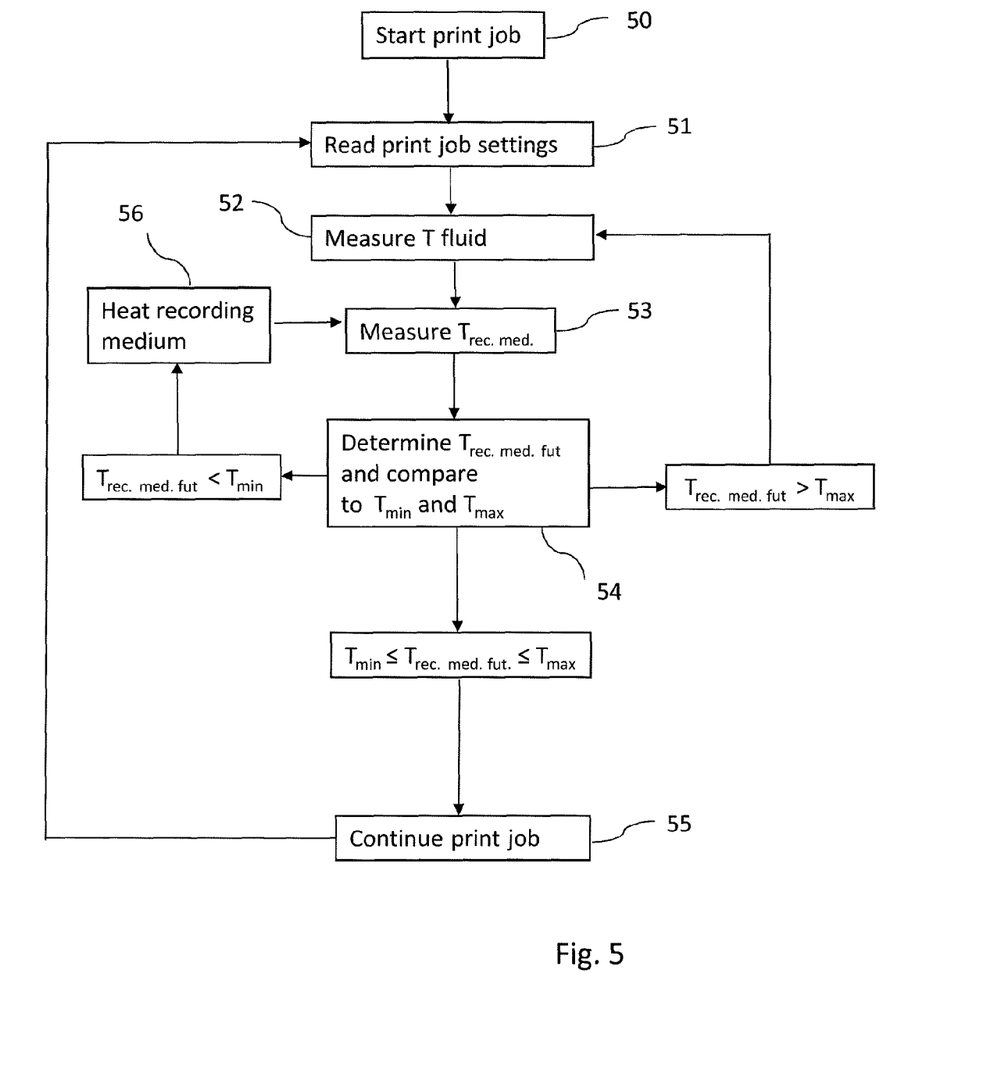
FIG. 5 shows a flow diagram of a method according to a second embodiment of the present invention.

FIG. 5 shows a flow diagram of a method according to a second embodiment of the present invention for applying an image of an electrically conductive material onto a recording medium. In step 50, the print job is started. The device 1 for jetting droplets of the electrically conductive fluid is then in an operative state and may be jetting, thereby expelling droplets of the electrically conductive fluid. The control unit 11 may control expelling of droplets by the inkjet device 1. In a second step 51, the control unit may read the job settings of a print job. The job settings may be stored on a memory means. The job settings may comprise e.g. the type of electrically conductive fluid contained in the fluid chamber body 6, the frequency of droplet ejection and the image to be applied on the recording medium. These job settings may influence the temperature of the recording medium. For example, if the fluid has a high temperature (e.g. is a molten metal), providing the droplet onto the recording medium may provide the recording medium with heat. The amount of heat applied to the recording medium may therefore be influenced by the number and size of droplets applied to the recording medium; the more electrically conductive material is applied to the recording medium, the more heat may be supplied to the recording medium. In a third step 52, the temperature of the fluid is measured. The temperature of the fluid may be at least the melting point of the fluid. The fluid may be measured directly, or may be measured indirectly, e.g. by measuring the temperature of the fluid chamber body 6. In a fourth step 53, the temperature of the recording medium is measured. This may be done by using suitable means, as described with regard to FIG. 4. Please note that in an alternative embodiment, the respective order of the second step 52, the third step 52 and the fourth step 53 may be interchanged. However, when the second to fourth step 51-53 are carried out, sufficient data may be available to determine a future temperature of the recording medium $T_{rec.\ med.\ fut}$.

In a fifth step 54, the future temperature of the recording medium $T_{rec.\ med.\ fut}$ is determined by the control unit. The future temperature of the recording medium $T_{rec.\ med.\ fut}$ may be determined based on the data acquired in the second to fourth step 51-53. In addition, to determine the future temperature $T_{rec.\ med.\ fut}$ data stored on a memory means may be used. For example, the future temperature $T_{rec.\ med.\ fut}$ may be calculated based on the data acquired in the second to fourth step 51-53, using an algorithm. Alternatively, the future temperature $T_{rec.\ med.\ fut}$ may be calculated based on the data acquired in the second to fourth step 51-53 using a look up table. A look up table may comprise data based on previously carried out measurements.

Additionally, in the fifth step 54, the future temperature of the recording medium $T_{rec.\ med.\ fut}$ is compared to predetermined temperatures $T_{min}$ and $T_{max}$. In case the future temperature of the recording medium is in the predefined temperature range between $T_{min}$ and $T_{max}$, the print job may be continued in the sixth step 55. When the print job is continued, the second step 51 may be repeated.

In case the future temperature of the recording medium exceeds $T_{max}$, no heating of the medium may take place. Moreover, the print job may not be continued, thereby being paused. When the temperature exceeds $T_{max}$, the third to fifth step 52-54 may be repeated. If the future temperature of the recording material then still exceeds $T_{max}$, then the third to fifth step 52-54 may be repeated again. However, if the future temperature of the recording medium $T_{rec.\ med.\ fut}$ is then within the predetermined range between $T_{min}$ and $T_{max}$, the print job may be continued in the sixth step 55.

In case the future temperature of the recording medium is lower than $T_{min}$, the recording medium may be heated in the seventh step 56. Then, the fourth step 53, wherein the temperature of the recording medium is measured, may be repeated and based thereon, the future temperature of the recording medium $T_{rec.\ med.\ fut}$ may be determined again. The cycle of the fourth, fifth and seventh step 53, 54, 56, may be repeated until the future temperature of the recording medium $T_{rec.\ med.\ fut}$ is within the predetermined temperature range. When the future temperature of the recording medium $T_{rec.\ med.\ fut}$ is within the predetermined temperature range, the print job may be continued in the sixth step 55.

Detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. In particular, features presented and described in separate dependent claims may be applied in combination and any advantageous combination of such claims are herewith disclosed.

Further, the terms and phrases used herein are not intended to be limiting; but rather, to provide an understandable description of the invention. The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language).

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A method for applying an image of an electrically conductive material onto a recording medium, the method comprising the steps of:

selecting an electrically conductive fluid and selecting a recording medium comprising a first material, wherein the electrically conductive fluid and the first material are capable of forming an eutectic alloy;

heating at least a part of the recording medium;

ejecting a droplet of the electrically conductive fluid onto the part of the recording medium, wherein the electrically conductive fluid is a molten metal or a molten semiconductor; and forming the eutectic alloy, wherein the at least a part of the recording medium is heated to a temperature above a melting point of the first material, and the recording medium is a silicon substrate.

2. The method according to claim 1, wherein in step b) the recording medium is heated using a laser.

3. The method according to claim 1, wherein electrically conductive fluid is selected from at least one of the group consisting of silver, gold, copper.

4. The method according to claim 1, wherein the electrically conductive fluid has a melting point of at least 300° C.

5. The method according to claim 2, wherein the electrically conductive fluid has a melting point of at least 300° C.

6. The method according to claim 3, wherein the electrically conductive fluid has a melting point of at least 300° C.

7. The method according to claim 1, wherein the at least a part of the recording medium is heated to the temperature above the melting point of the first material before ejecting the droplet of the electrically conductive fluid onto the part of the recording medium.

* * * * *